United States Patent
Takeuchi et al.

(10) Patent No.: US 9,412,831 B2
(45) Date of Patent: Aug. 9, 2016

(54) MANUFACTURING METHOD FOR SILICON CARBIDE SEMICONDUCTOR DEVICE

(71) Applicant: DENSO CORPORATION, Kariya, Aichi-pref. (JP)

(72) Inventors: Yuichi Takeuchi, Obu (JP); Naohiro Sugiyama, Nagoya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/391,015

(22) PCT Filed: May 16, 2013

(86) PCT No.: PCT/JP2013/003123
§ 371 (c)(1),
(2) Date: Oct. 7, 2014

(87) PCT Pub. No.: WO2013/172032
PCT Pub. Date: Nov. 21, 2013

(65) Prior Publication Data
US 2015/0072485 A1    Mar. 12, 2015

(30) Foreign Application Priority Data
May 18, 2012    (JP) .................................. 2012-114739

(51) Int. Cl.
*H01L 29/66* (2006.01)
*H01L 29/808* (2006.01)
(Continued)

(52) U.S. Cl.
CPC ...... *H01L 29/66068* (2013.01); *H01L 21/0475* (2013.01); *H01L 22/12* (2013.01); *H01L 22/20* (2013.01); *H01L 29/8083* (2013.01); *H01L29/0619* (2013.01); *H01L 29/0638* (2013.01); *H01L 29/0661* (2013.01); *H01L 29/1608* (2013.01)

(58) Field of Classification Search
CPC ............ H01L 21/0475; H01L 29/0619; H01L 29/0683; H01L 29/0661; H01L 29/66068; H01L 29/8083; H01L 29/1608
See application file for complete search history.

(56) References Cited

U.S. PATENT DOCUMENTS 6,004,865 A * 12/1999 Horiuchi et al. .............. 438/459
2003/0178672 A1    9/2003 Hatakeyama et al.
(Continued)

FOREIGN PATENT DOCUMENTS

| JP | 01-175226 A | 7/1989 |
| JP | 2559373 B2 | 9/1996 |
| JP | 2010-025848 A | 2/2010 |

OTHER PUBLICATIONS

Office Action mailed Oct. 21, 2014 for the corresponding JP application No. 2012-114739 (and English translation).
(Continued)

*Primary Examiner* — Marvin Payen
*Assistant Examiner* — Victor Barzykin
(74) *Attorney, Agent, or Firm* — Posz Law Group, PLC

(57) ABSTRACT

In a method of manufacturing a silicon carbide semiconductor device having a JFET, after forming a second concave portion configuring a second mesa portion, a thickness of a source region is detected by observing a pn junction between the source region and a first gate region exposed by the second concave portion. Selective etching is conducted on the basis of the detection result to form a first concave portion deeper than the thickness of the source region and configuring a first mesa portion inside of an outer peripheral region in an outer periphery of a cell region, and to make the second concave portion deeper than the second gate region.

10 Claims, 3 Drawing Sheets

(51) Int. Cl.
   *H01L 21/04* (2006.01)
   *H01L 21/66* (2006.01)
   *H01L 29/06* (2006.01)
   *H01L 29/16* (2006.01)

(56) References Cited

U.S. PATENT DOCUMENTS

2005/0233539 A1    10/2005    Takeuchi et al.
2008/0117945 A1*   5/2008     Kuramoto ................ 372/45.011
2010/0025693 A1*   2/2010     Malhan et al. ................. 257/76
2011/0156054 A1    6/2011     Takeuchi et al.

OTHER PUBLICATIONS

International Search Report and Written Opinion of the International Searching Authority mailed Jul. 30, 2013 for the corresponding International application No. PCT/JP2013/003123 (and English translation).

* cited by examiner

US 9,412,831 B2

MANUFACTURING METHOD FOR SILICON CARBIDE SEMICONDUCTOR DEVICE

CROSS REFERENCE TO RELATED APPLICATION

This present disclosure is a U.S. national stage application of PCT/JP2013/003123 filed on May 16, 2013 and is based on Japanese Patent Application No. 2012-114739 filed on May 18, 2012, the disclosures of which are incorporated herein by reference.

TECHNICAL FIELD

The present disclosure relates to a method for manufacturing a silicon carbide (SiC) semiconductor device having a junction field effect transistor (JFET) of a trench structure.

BACKGROUND ART

PTL 1 discloses an SiC semiconductor device having a JFET with a trench structure. The JFET is formed as follows.

After an $n^-$ type drift layer, a $p^+$ type first gate region, and an $n^+$ type source region have been formed on an $n^+$ type SiC substrate in the stated order, a trench that penetrates through those regions is formed. Then, an $n^-$ type channel layer and a $p^+$ type second gate region are allowed to epitaxially grow within the trench, and embedded within the trench. Thereafter, a substrate surface is planarized, and unnecessary portions of the $n^-$ type channel layer and the $p^+$ type second gate region are removed to expose the $n^+$ type source region. Subsequently, the substrate surface is etched with the use of a mask for exposing an outer peripheral region that surrounds a cell region in which the JFET is configured. The $n^+$ type source region is removed in the outer peripheral region, and a first concave portion is formed in the outer peripheral region to form a first mesa portion.

Further, the substrate surface is etched with the use of a mask for exposing an outer edge of the first mesa portion in the outer peripheral region, the $p^+$ type first gate region is further removed, and a second concave portion is formed within the first concave portion to form a second mesa portion. Thereafter, after a p type surface electric field relaxation (resurf) layer has been formed at a boundary position between a side surface and a bottom surface of the second concave portion, or ion implantation for forming a p type guard ring layer is conducted on the bottom surface of the second concave portion, the bottom surface of the second concave portion is activated through a heat treatment. In addition, the JFET disclosed in PTL 1 is formed through a process of forming an interlayer insulating film on a substrate front surface side, a process of forming a gate electrode and a source electrode, and a process of forming a drain electrode on a substrate rear surface side.

CITATION LIST

Patent Literature

PTL 1: JP-A-2010-34381 (corresponding to US 2010/0025693 A1)

SUMMARY OF INVENTION

Technical Problem

However, when the substrate surface is planarized after the $n^-$ type channel layer and the $p^+$ type second gate region have epitaxially grown within the trench, the removal amount of the $n^+$ type source region in the planarizing process varies in the existing technique. Because a thickness of the residual $n^+$ type source region is small, it is difficult to grasp an actual removal amount by optical evaluation using Fourier transform infrared spectroscopy (FT-IR). For that reason, the removal amount is grasped according to a difference between the substrate thicknesses before and after planarization in the present circumstances, but precision higher than ±0.5 µm level cannot be obtained.

For that reason, the removal of the $n^+$ type source region becomes larger than a desired set value, and the thickness of the $p^+$ type first gate region located in a lower layer of the first mesa portion may be thinned or eliminated when forming the first concave portion for forming the first mesa portion. This is one of causes of reduction in an element breakdown voltage.

In view of the above, an object of the present disclosure is to provide a method of manufacturing an SIC semiconductor device, which can inhibit a thickness of a first gate region from being unnecessarily thinned, or eliminated.

Solution to Problem

According to an aspect of the present disclosure, there is provided a method of manufacturing a silicon carbide semiconductor device for forming a JFET in a cell region of a semiconductor substrate, and forming a first concave portion that configures a first mesa portion in an outer periphery of the cell region, and a second concave portion that configures a second mesa portion in an outer peripheral position of the cell region than a stepped portion of the first mesa portion within the first concave portion.

In the method of manufacturing the silicon carbide semiconductor device, the semiconductor substrate is prepared. The semiconductor substrate includes a first conductivity type substrate that is made of silicon carbide, a drift layer of a first conductivity type that is formed on the first conductivity type substrate by epitaxial growth, a first gate region of a second conductivity type that is formed on the drift layer by the epitaxial growth, and a source region of the first conductivity type that is formed on the first gate region by the epitaxial growth or ion implantation.

A strip-like trench that penetrates through the source region and the first gate region, and reaches the drift layer with one direction as a longitudinal direction is formed, a channel layer of the first conductivity type is formed on an inner wall of the trench by epitaxial growth, a second gate region of the second conductivity type is formed on the channel layer by epitaxial growth, and the channel layer and the second gate region are planarized to expose the source region.

After the planarizing, the second concave portion having a depth deeper than the source region, and as deep as a boundary portion between the source region and the first gate region is exposed is formed in an outer peripheral region surrounding a cell region, with a region in which the trench is formed as the cell region in which the JFET is configured, by conducting selective etching.

After forming the second concave portion, a thickness of the source region is detected by observing a pn junction between the source region and the first gate region exposed by the second concave portion. Selective etching is conducted on the basis of the detection result, the first concave portion deeper than the thickness of the source region is formed inside of the outer peripheral region in an outer periphery of the cell region, and the second concave portion is made deeper than the second gate region.

After forming an interlayer insulating film on surfaces of the second gate region, the channel region, and the source region, contact holes are formed in the interlayer insulating film, and a gate electrode connected to at least one of the first gate region and the second gate region, and a source electrode connected to the source region are formed through the contact holes. A drain electrode is formed on a rear surface of the first conductivity type substrate.

In the method of manufacturing the silicon carbide semiconductor device, the first concave portion configuring the first mesa portion is formed after the second concave portion configuring the second mesa portion has been formed. As a result, the thickness of the source region can be detected by the SEM observation on the basis of the pn junction between the source region and the first gate region due to the stepped portion of the second concave portion before the selective etching for forming the first concave portion. Therefore, the etching can be precisely conducted by the degree of thickness of the source region when forming the first concave portion, and the etching depth can be precisely controlled. For that reason, the first gate region can be prevented from being unnecessarily thinned, or eliminated.

BRIEF DESCRIPTION OF DRAWINGS

The above and other objects, features and advantages of the present disclosure will become more apparent from the following detailed description made with reference to the accompanying drawings. In the drawings.

DESCRIPTION OF EMBODIMENTS

Hereinafter, embodiments of the present disclosure will be described with reference to the drawings. In the following respective embodiments, parts identical with or equivalent to each other are denoted by the same symbols for description.

(First Embodiment)

Figure 1:
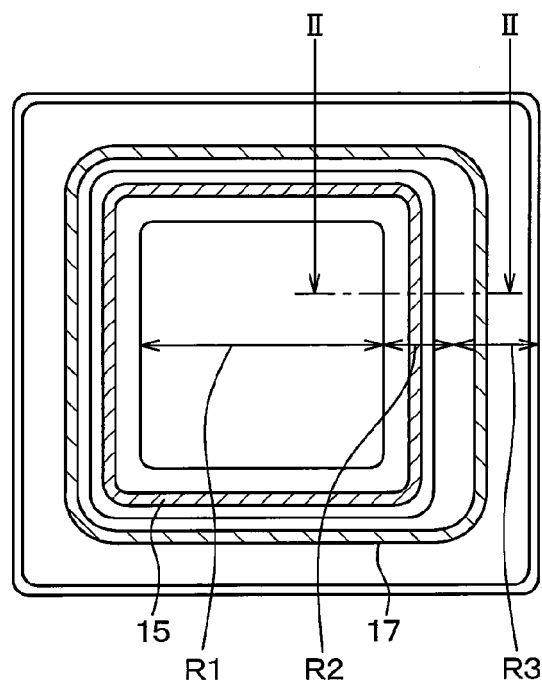
FIG. 1 is a top layout view of an SiC semiconductor device according to a first embodiment of the present disclosure.

A first embodiment of the present disclosure will be described. As illustrated in FIG. 1, an SiC semiconductor device is structured to include a cell region R1, an electric field relaxation region R2, and an outer peripheral region R3. A JFET is formed in the cell region R1. The cell region R1 has a square shape whose corners are rounded in a top shape. The electric field relaxation region R2 functions to relax electric field concentration in an outer peripheral region of the cell region R1. The electric field relaxation region R2 is arranged between the cell region R1 and the outer peripheral region R3, and has a square frame shape whose corners are rounded so as to surround the periphery of the cell region R1. The outer peripheral region R3 extensively spreads and terminates an electric field extending from the cell region R1 on an outer peripheral side of the SiC semiconductor device, to thereby provide a high breakdown voltage. The outer peripheral region R3 has a square frame shape whose corners are rounded so as to surround the periphery of the electric field relaxation region R2 in a top shape.

Figure 2:
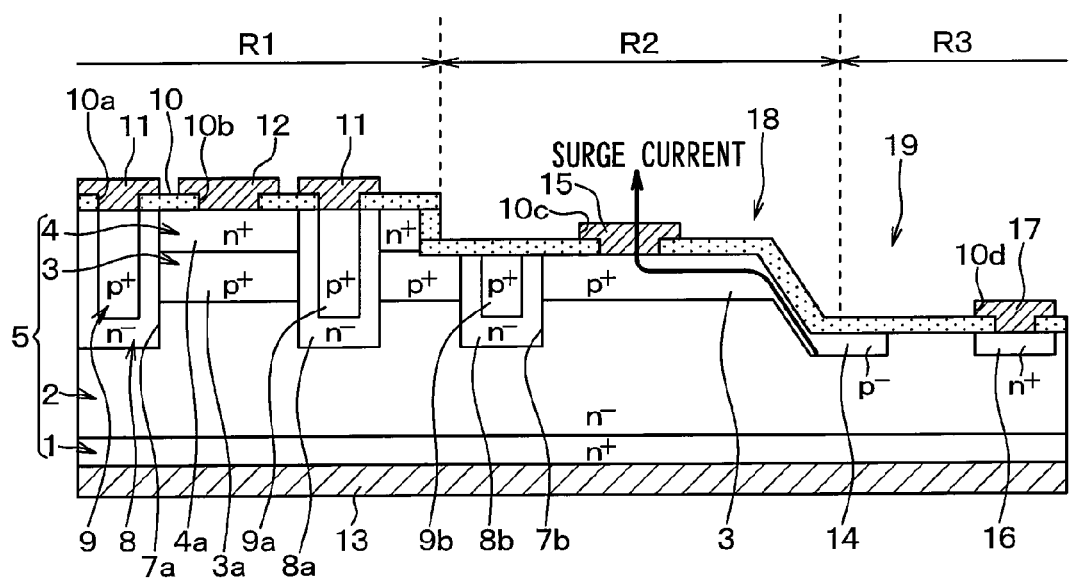
FIG. 2 is a cross-sectional view of the SiC semiconductor device taken along a line II-II in FIG. 1.

Specifically, as illustrated in FIG. 2, the SiC semiconductor device includes an $n^+$ type substrate (substrate) 1, an $n^-$ type drift layer (first semiconductor layer) 2, a $p^+$ type layer (second semiconductor layer) 3, and an $n^+$ type layer (third semiconductor layer) 4. The $n^+$ type substrate 1 has an impurity concentration equal to or higher than, for example, $1\times10^{19}$ $cm^{-3}$. The $n^-$ type drift layer 2 has an impurity concentration lower than the $n^+$ type substrate 1, for example, $1\times10^{15}$ to $5\times10^{16}$ $cm^{-3}$. The $p^+$ type layer 3 has an impurity concentration of, for example, $1\times10^{18}$ to $5\times10^{19}$ $cm^{-3}$. The $n^+$ type layer 4 has an impurity concentration higher than the $n^-$ type drift layer 2, for example, $1\times10^{18}$ to $5\times10^{20}$ $cm^{-3}$. The $n^+$ type substrate 1, the $n^-$ type drift layer 2, the $p^+$ type layer 3, and the $n^+$ type layer 4 are each made of SiC, and configure a semiconductor substrate 5. As illustrated in FIG. 1, a center portion of the semiconductor substrate 5 forms the cell region R1, and the electric field relaxation region R2 and the outer peripheral region R3 are arranged with the cell region R1 as a center in the stated order.

Also, as illustrated in FIG. 2, a trench 7a that penetrates through the $n^+$ type layer 4 and the $p^+$ type layer 3, and reaches the n type drift layer 2 is formed in a main surface side of the semiconductor substrate 5 in the cell region R1. The trench 7a extends in a strip with one direction (a direction perpendicular to a paper plane in the present embodiment) on a substrate plane as a longitudinal direction. An $n^-$ type layer (first conductivity type layer) 8, and a $p^+$ type layer (second conductivity type layer) 9 are formed in the stated order so as to be embedded in the trench 7a. The $n^-$ type layer 8 has a thickness of, for example, 0.1 to 0.5 μm, and an impurity concentration of $1.0\times10^{16}$ to $1.0\times10^{18}$ $cm^{-3}$. The $p^+$ type layer 9 has an impurity concentration of $1\times10^{18}$ to $5\times10^{20}$ $cm^{-3}$. A first gate region 3a is formed by the $p^+$ type layer 3, a second gate region 9a is formed by the $p^+$ type layer 9, an $n^+$ type source region 4a is formed by the $n^+$ type layer 4, and an $n^-$ type channel layer 8a is formed by the $n^-$ type layer 8.

The impurity concentrations of the an $n^-$ type channel layer 8a and the first and second gate regions 3a and 9a, and the thickness of the $n^-$ type channel layer 8a are set according to an operating mode of the JFET, and in the present embodiment, the JFET is set to operate in a normally off manner.

Also, a gate electrode 11 and a source electrode 12 are formed over the surfaces of the $n^+$ type layer 4, the $n^-$ type layer 8, and the $p^+$ type layer 9 through an interlayer insulating film 10. The gate electrode 11 is electrically connected to the second gate region 9a through a contact hole 10a formed in the interlayer insulating film 10, and also electrically connected to the first gate region 3a in another cross-section different from that of FIG. 2. The source electrode 12 is electrically connected to the $n^+$ type source region 4a through a contact hole 10b formed in the interlayer insulating film 10. The gate electrode 11 is made of, for example, Al which is a material that enables an ohmic contact with the $p^+$ type layer, and Ni laminated on Al. The source electrode 12 is made of, for example, Ni.

A drain electrode 13 electrically connected to an overall rear surface of the $n^+$ type substrate 1 is formed on a rear surface of the semiconductor substrate 5. The JFET is formed with the above structure, and the cell region R1 in which plural JFETs are collected in a cell is formed.

Also, a first concave portion 18 from which the $n^+$ type layer 4 of the semiconductor substrate 5 is removed by etching is formed in the electric field relaxation region R2. For that reason, a boundary portion of the electric field relaxation region R2 with the cell region R1 forms a first mesa portion in which a stepped portion is formed, and the p$^+$ type layer 3 is exposed.

A trench 7b that reaches the n$^-$ type drift layer 2 so as to divide between the cell region R1 and the outer peripheral region R3 (surround the periphery of the cell region R1 in the present embodiment) is formed on the cell region R1 side of the electric field relaxation region R2. The n$^-$ type layer 8 and the p$^+$ type layer 9 are arranged to be embedded in the trench 7b. The n type layer 8 and the p$^+$ type layer 9 in the electric field relaxation region R2 function as an n type region 8b and a p type region 9b configuring a pn separation part. FIG. 2 illustrates a structure in which only one trench 7b is formed to provide one pn separation part. Alternatively, plural trenches 7b may be concentrically arranged to surround the cell region R1 to provide plural pn separation parts.

Also, a p$^-$ type resurf layer 14 extends from the stepped portion forming the boundary portion of the electric field relaxation region R2 with the outer peripheral region R3 into the outer peripheral region R3 which will be described later. The p$^-$ type resurf layer 14 is $1.0 \times 10^{17}$ to $5.0 \times 10^{17}$ cm$^{-3}$ in the p type impurity concentration. In the present embodiment, the stepped portion forming the boundary portion between the electric field relaxation region R2 and the outer peripheral region R3 has an inclined mesa shape, and the p$^-$ type resurf layer 14 extends over the overall surface of the stepped portion, resulting in a structure where the p$^+$ type layer 3 and the p$^-$ type resurf layer 14 are connected to each other. A surge drawing electrode 15 is disposed in an outer periphery (an outer peripheral side of the outermost peripheral trench if the plural trenches 7b are provided) of the trench 7b so as to come in contact with a surface of the p$^+$ type layer 3 through a contact hole 10c formed in the interlayer insulating film 10.

Also, a second concave portion 19 from which the p$^+$ type layer 3 and the n$^+$ type layer 4 of the semiconductor substrate 5 are removed by etching is formed in the outer peripheral region R3. For that reason, in the outer peripheral region R3, the n$^-$ type drift layer 2 is exposed, and the boundary portion between the electric field relaxation region R2 and the outer peripheral region R3 forms the stepped portion as a second mesa portion. In a surface layer portion of the n$^-$ type drift layer 2, the above-described p$^-$ type resurf layer 14 extends toward the outer peripheral side of the cell region R1. Further, an n$^+$ type layer 16 is formed to surround an outer periphery of the p$^-$ type resurf layer 14, and an equipotential ring (EQR) electrode 17 is disposed to be electrically connected to the n$^+$ type layer 16 through a contact hole 10d formed in the interlayer insulating film 10.

The SiC semiconductor device according to the present embodiment is configured with the above structure. Subsequently, a description will be given of the operation of the JFET provided in the cell region R1 of the SiC semiconductor device configured as described above.

In the present embodiment, the JFET operates in a normally off manner. First, in a state before a gate voltage is applied to the first gate region 3a and the second gate region 9a, the n$^-$ type channel layer 8a pinches off by a depletion layer extending from both of the first gate region 3a and the second gate region 9a to the n$^-$ type channel layer 8a. For that reason, no channel region is set, and no current flows between the source and the drain. On the other hand, when the gate voltage is applied to the first gate region 3a and the second gate region 9a, the amount of extension of the depletion layer extending from both of the first and second gate regions 3a and 9a toward the n$^-$ type channel layer 8a side is controlled to reduce the amount of extension of depletion layer extending to the n$^n$ type channel layer 8a. For that reason, the channel region is set, and the current flows between the source and the drain. When the application of the gate voltage to the first gate region 3a and the second gate region 9a stops, the JFET turns off.

Also, when surge is generated, an avalanche breakdown is generated in the p$^-$ type resurf layer 14, a surge current flows along a current path illustrated in FIG. 1, and the surge current can be drawn from the surge drawing electrode 15 side.

In the above SiC semiconductor device, the element separation between the cell region R1 and the outer peripheral region R3 is conducted by the pn separation portion having the p type region 9b and the n type region 8b provided in the electric field relaxation region R2. For that reason, compared with a case where an oxide film is arranged within the trench to conduct the element separation, because there is no breakdown of the oxide film for element separation, a breakdown voltage between the cell region R1 in which the JFET is formed and the outer peripheral region R3 can be improved.

Also, because the p$^-$ type resurf layer 14 extends to the stepped portion forming the boundary portion between the electric field relaxation region R2 and the outer peripheral region R3, an electric field applied to the interlayer insulating film 10 formed on the surface of the p$^-$ type resurf layer 14 can be reduced. For that reason, the breakdown caused by the electric field concentration of the interlayer insulating film 10 can be also suppressed.

Subsequently, a description will be given of a process of manufacturing the SiC semiconductor device illustrated in FIG. 1 with reference to manufacturing process diagrams of FIGS. 3A to 4C.

Figure 3A:
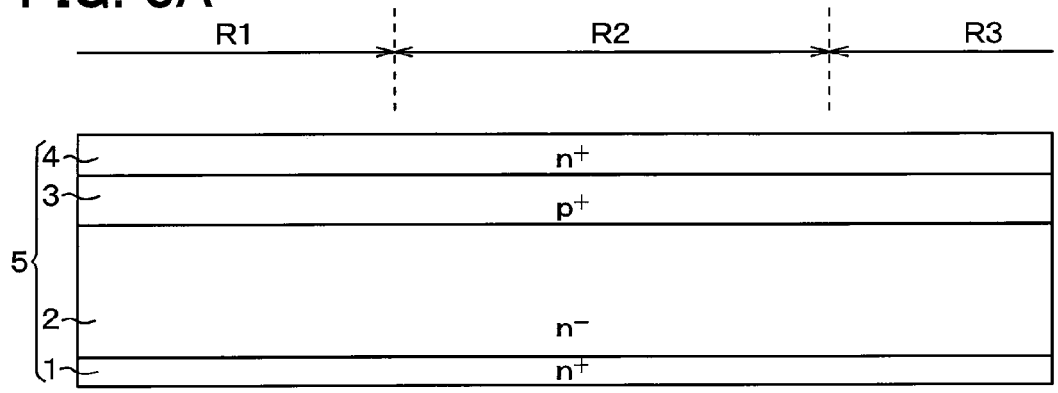
FIG. 3A is a cross-sectional view partially illustrating a process of manufacturing the SiC semiconductor device.

First, in a process illustrated in FIG. 3A, the semiconductor substrate 5 is prepared in which the n$^-$ type drift layer 2 having the impurity concentration of, for example, $1 \times 10^{15}$ to $5 \times 10^{16}$ cm$^{-3}$, the p$^+$ type layer 3 having the impurity concentration of, for example, $1 \times 10^{18}$ to $5 \times 10^{19}$ cm$^{-3}$, and the n$^+$ type layer 4 having the impurity concentration of, for example, $1 \times 10^{18}$ to $5 \times 10^{20}$ cm$^{-3}$ are allowed to epitaxially grow on the n$^+$ type substrate 1 having the impurity concentration of, for example, $1 \times 10^{16}$ cm$^{-3}$ or higher.

Figure 3B:
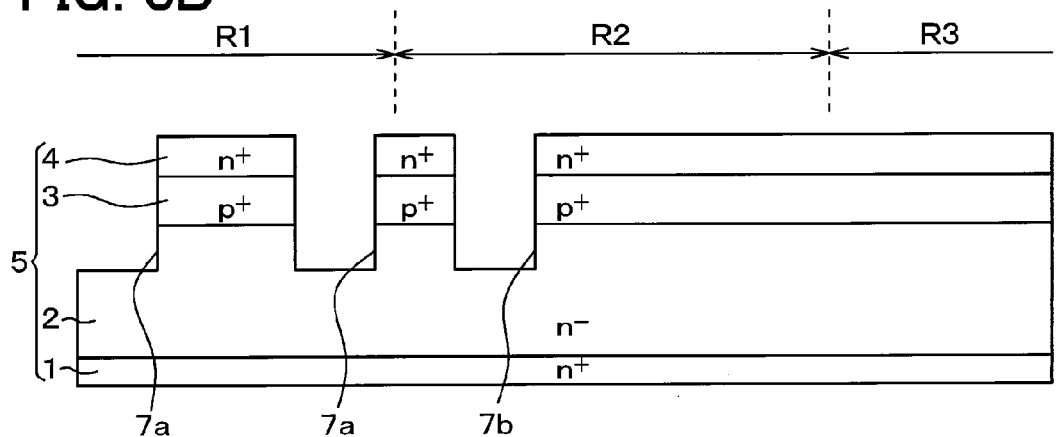
FIG. 3B is a cross-sectional view partially illustrating the process of manufacturing the SiC semiconductor device.

In a process illustrated in FIG. 3B, after a mask not shown has been arranged on the surface of the semiconductor substrate 5, regions in which the trench 7a of the cell region R1, and the trench 7b of the electric field relaxation region R2 are to be formed are opened. In addition, etching is conducted with the use of the mask to form the trenches 7a and 7b that penetrate through the n$^+$ type layer 4 and the p$^+$ type layer 3, and reach the n$^-$ type drift layer 2 at the same time. With the above process, the p$^+$ type layer 3 and the n$^+$ type layer 4 are divided into plural pieces by the trench 7a, and the first gate region 3a and the n$^+$ type source region 4a are formed by the p$^+$ type layer 3 and the n$^+$ type layer 4 located on the side surface of the trench 7. Thereafter, the mask is removed.

Figure 3C:
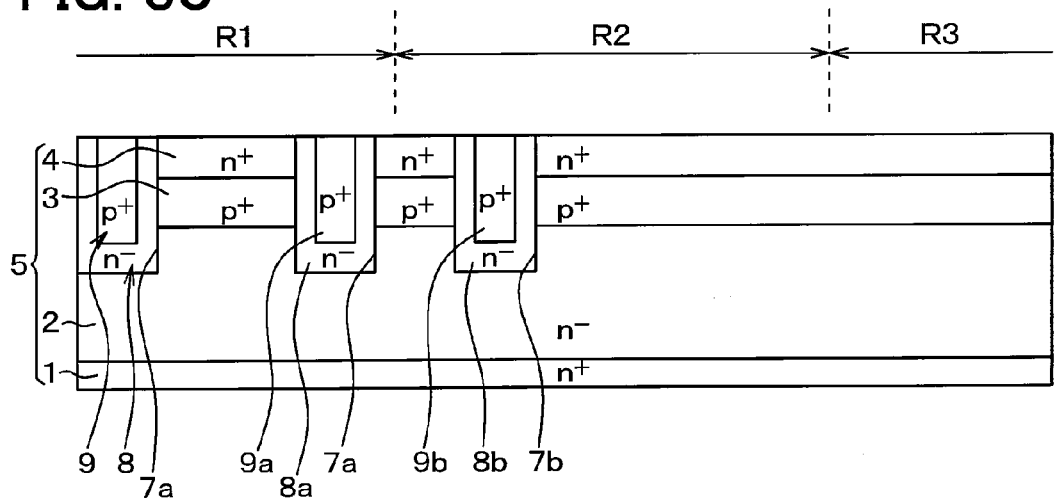
FIG. 3C is a cross-sectional view partially illustrating the process of manufacturing the SiC semiconductor device.

In a process illustrated in FIG. 3C, the n$^-$ type layer 8 and the p$^+$ type layer 9 are allowed to epitaxially grow, and laminated on the surface of the semiconductor substrate 5 in the stated order so as to be embedded within the trenches 7a and 7b. In addition, the n$^-$ type layer 8 and the p$^+$ type layer 9 are left only within the trenches 7a and 7b to expose the surface of the n$^+$ type layer 4 through the planarizing process using grinding or chemical mechanical polishing (CMP). With the above process, then n$^-$ type channel layer 8a and the second gate region 9a can be formed within the trench 7a of the cell region R1, and the pn junction of the n type region 8b and the p type region 9b can be formed within the trench 7b of the electric field relaxation region R2.

Figure 4A:
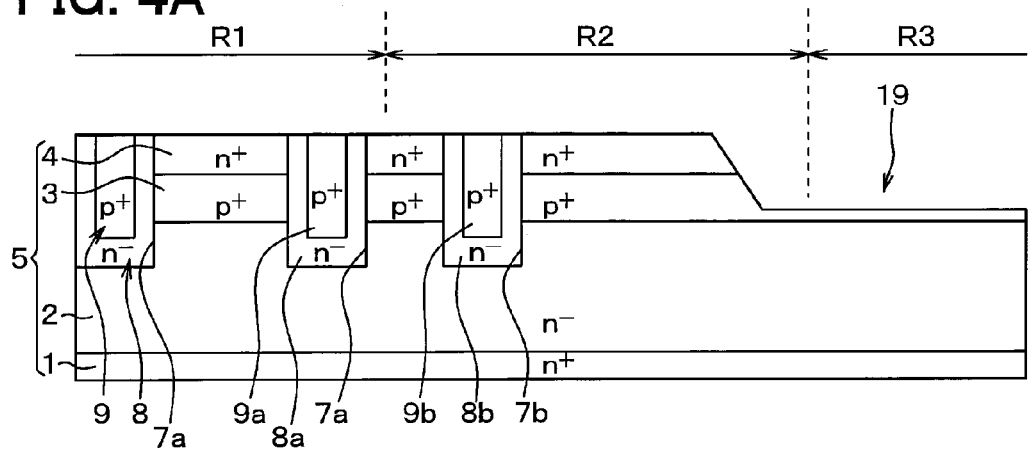
FIG. 4A is a cross-sectional view partially illustrating the process of manufacturing the SiC semiconductor device.

In a process illustrated in FIG. 4A, a mask that covers the cell region R1 and the electric field relaxation region R2 of the semiconductor substrate 5 is arranged, and the n$^+$ type layer 4 and the p$^+$ type layer 3 are removed in the outer peripheral region R3 by etching. For example, anisotropic etching is conducted in a mixed gas atmosphere of SF$_6$, O$_2$, and Ar. With the above process, the second concave portion 19 is formed in the outer peripheral region R3 to expose the p$^+$ type layer 3, and the boundary portion between the electric field relaxation region R2 and the outer peripheral region R3 forms the stepped portion as the second mesa portion. In this situation, it is preferable that the mesa portion of the boundary portion between the electric field relaxation region R2 and the outer peripheral region R3 is tapered. For example, the tapered mesa portion can be formed by adjusting a condition of the anisotropic etching, or conducting the anisotropic etching using a plane orientation dependence, or isotropic etching.

Thereafter, sacrificial oxidation or chemical dry etching is implemented for removal of the etching damage layer as needed. The etching damage layer is formed in a state where the surface is rough by etching for forming the second concave portion 19. The surface roughness can be reduced by removal of the etching damage layer. Specifically, the etching damage layer can be easily removed by the sacrificial oxidation, and the etching damage layer can be removed in a shorter time by the chemical dry etching.

Figure 4B:
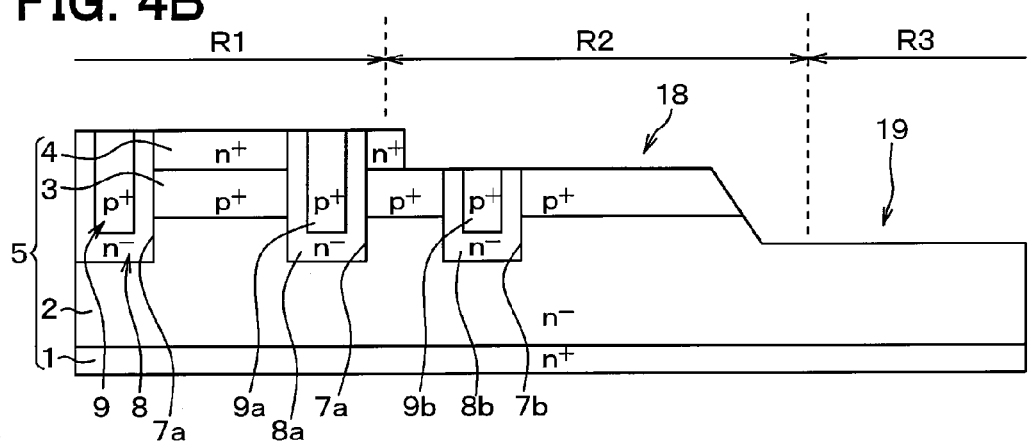
FIG. 4B is a cross-sectional view partially illustrating the process of manufacturing the SiC semiconductor device.

In a process illustrated in FIG. 4B, a mask not shown that covers the cell region R1 of the semiconductor substrate 5 is arranged, and etching is conducted in the electric field relaxation region R2 and the outer peripheral region R3 as deep as the thickness of the n$^+$ type layer 4 can be removed. For example, anisotropic etching is conducted in a mixed gas atmosphere of SF$_6$, O$_2$, and Ar. With the above process, the first concave portion 18 is formed in the electric field relaxation region R2, the surface of the p$^+$ type layer 3 is exposed, the second concave portion 19 is made deeper in the outer peripheral region R3 whereby the step of the second mesa portion is displaced to a deeper position, and the n$^-$ type drift layer 2 is exposed. In addition, the boundary portion between the cell region R1 and the electric field relaxation region R2 forms the stepped portion as the first mesa portion.

In the conventional art, because the process illustrated in FIG. 4A is conducted after the process illustrated in FIG. 4B, there is no reference for grasping an etching depth at the time of etching for forming the first concave portion 18. However, as in the present embodiment, the process illustrated in FIG. 4B is implemented after the process illustrated in FIG. 4A so that the second concave portion 19 has already been formed at the time of etching for forming the first concave portion 18. For that reason, when the process of FIG. 4A is conducted, the pn junction between the p$^+$ type layer 3 and the n$^+$ type layer 4 is present in the stepped portion of the boundary portion between the electric field relaxation region R2 and the outer peripheral region R3. The thickness of the n$^+$ type layer 4 can be detected by observing that portion through SEM. Therefore, in the process illustrated in FIG. 4B, because the etching depth can be accurately controlled, the p$^+$ type layer 3 can be prevented from being too thinned, or eliminated.

In particular, if the etching damage layer is removed to reduce the surface roughness after the process illustrated in FIG. 4A described above, since the surface state becomes excellent, the pn junction can be easily evaluated by the SEM observation.

Figure 4C:
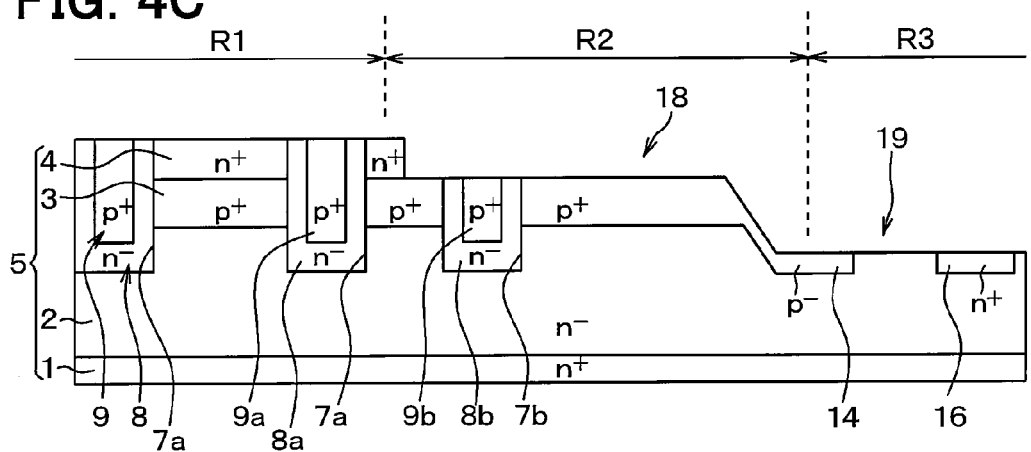
FIG. 4C is a cross-sectional view partially illustrating the process of manufacturing the SiC semiconductor device.

In a process illustrated in FIG. 4C, a mask that opens in a region of the surface of the semiconductor substrate 5 in which the p$^-$ type resurf layer 14 is to be formed is arranged, and p type impurities are ion-implanted. If the stepped portion of the boundary portion between the electric field relaxation region R2 and the outer peripheral region R3 is tapered as described above, the p type impurities can be also implanted into the stepped portion by only ion implantation from a direction perpendicular to the substrate. Even if the stepped portion of the boundary portion between the electric field relaxation region R2 and the outer peripheral region R3 is perpendicular to the surface of the semiconductor substrate 5, if the p type impurities are obliquely ion-implanted, the p type impurities can be implanted even in the stepped portion.

Subsequently, after the mask used previously has been removed, a mask that opens in a region where the n$^+$ type layer 16 is to be formed is arranged, and n type impurities are ion-implanted. In addition, a heat treatment is conducted to activate the implanted ions to form the p type resurf layer 14 and the n$^+$ type layer 16.

Thereafter, although not shown, after the interlayer insulating film 10 has been formed, the contact holes 10a to 10d are formed by patterning. Also, after metal films made of Al that enables an ohmic contact with the p type SiC, and Ni that enables an ohmic contact with the n type SiC have been formed, the metal films are patterned to form the gate electrode 11, the source electrode 12, the surge drawing electrode 15, and the equipotential ring electrode 17. In addition, the SiC semiconductor device according to the present embodiment is completed through a process of forming the drain electrode 13.

As described above, in the present embodiment, the first concave portion 18 configuring the first mesa portion is formed after the second concave portion 19 configuring the second mesa portion has been formed. As a result, the thickness of the n$^+$ type layer 4 can be detected by the SEM observation on the basis of the pn junction between the p$^+$ type layer 3 and the n$^+$ type layer 4 in the stepped portion of the boundary portion between the electric field relaxation region R2 and the outer peripheral region R3 due to the second concave portion 19 before the selective etching for forming the first concave portion 18. Therefore, the etching can be precisely conducted by the degree of thickness of the n$^+$ type layer 4 when forming the first concave portion 18, and the etching depth can be precisely controlled. For that reason, the p$^+$ type layer 3 for forming the first gate region 3a can be prevented from being unnecessarily thinned, or eliminated.

Also, after the second mesa portion has been formed by the formation of the second concave portion 19, the first mesa portion is formed with the formation of the first concave portion 18. For that reason, corners on the stepped portion of the second concave portion 19 are rounded by etching for forming the first concave portion 18. For that reason, the electric field concentration on the stepped portion can be reduced, and the interlayer insulating film 10 formed on the stepped portion can be effectively inhibited from being broken down by the electric field concentration.

(Second Embodiment)

A second embodiment of the present disclosure will be described. In the present embodiment, the configuration of the leading ends of the trench 7a in the first embodiment is changed, and other configurations are identical with those in the first embodiment, and therefore only parts different from those in the first embodiment will be described.

In the present embodiment, in the SiC semiconductor device according to the first embodiment, the first concave portion 18 is formed to remove the n$^+$ type source region 4a in the vicinity of both the leading ends of the trench 7a for forming the JFET. That is, the trench 7a illustrated in FIG. 2 is laid out in a strip with a direction perpendicular to the paper plane as the longitudinal direction, and the first concave portion 18 extends to an inside of the trench 7a on positions of both the leading ends. With the above structure, the JFET structure is not formed on the leading ends of the trench 7a.

The trench 7a is laid out in the strip as described above, but the thickness of the n⁻ type layer 8 becomes thicker than the side wall surface configuring long sides of the trench in both of the leading ends, due to migration at the time of epitaxial growth. For that reason, thresholds of other portions and the JFET are varied on both of the leading ends of the trench 7a, the leakage of a drain voltage to the surface occurs when the gate voltage comes closer to the threshold at the time of driving the JFET, resulting in such a problem that an excessive drain current flows to reduce the element breakdown voltage. For that reason, as in the present embodiment, the n⁺ type source region 4a is removed on both of the leading ends of the trench 7a so that the JFET structure is not formed on those portions. With the above structure, because the threshold variation can be prevented, the leakage of the drain voltage to the surface can be prevented, and a reduction in the element breakdown voltage caused when the excessive drain current flows can be prevented from being generated.

Also, in this structure, as in the first embodiment, the second concave portion 19 is formed before the formation of the first concave portion 18 for removing the n⁺ type source region 4a on both of the leading ends of the trench 7a, as a result of which the thickness of the n⁺ type source region 4a can be grasped by the SEM observation. For that reason, the etching can be precisely conducted by the degree of thickness of the n⁺ type source region 4a when forming the first concave portion 18, and the etching depth can be precisely controlled. Hence, the same advantages as those in the first embodiment can be obtained.

(Other Embodiments)

In the above respective embodiments, a case in which the first gate region 3a and the second gate region 9a have the same potential has been described. Alternatively, those regions may have potentials different from each other such that the first gate region 3a has a first potential, and the second gate region 9a has a second potential. In this case, the first potential for controlling the first gate region 3a, and the second potential for controlling the second gate region 9a may change to potentials independent from each other, or only any one potential can be controlled, and the other potential may be set to GND (source potential). For example, only the first potential for controlling the first gate region 3a may change whereas the second potential to be applied to the second gate region 9a may be fixed to GND.

In the above respective embodiments, a structure in which the equipotential ring electrode 19 is arranged in the outer peripheral region R3 has been described as an example. Alternatively, a p type guard ring may be provided. That is, any of various structures known as an outer peripheral high breakdown voltage structure may be formed in the outer peripheral region R3.

Further, in the above embodiments, the epitaxially grown n⁺ type source region 4 has been described. Alternatively, the n⁺ type source region 4 may be formed by ion implantation of n type impurities into the first gate region 3. Also, in this case, when the ion implantation is conducted so that the n⁺ type source region 4 extends to both of the leading ends of the trench 6, the first concave portion 18 extends to both of the leading ends of the trench 7a, thereby being capable of obtaining the same advantages as those in the second embodiment.

In the above respective embodiments, the JFET of the n-channel type in which the channel region is set in the n⁻ type channel layer 8a has been described as an example. Alternatively, the present disclosure can be applied to the JFET of a p-channel type in which the conductivity type of the respective components is reversed.

The invention claimed is:

1. A method of manufacturing a silicon carbide semiconductor device for forming a Junction Field Effect Transistor (JFET) in a cell region of a semiconductor substrate, and forming a first concave portion that configures a first mesa portion in an outer periphery of the cell region, and a second concave portion that configures a second mesa portion in an outer peripheral position of the cell region than a stepped portion of the first mesa portion within the first concave portion, the method comprising:

preparing the semiconductor substrate including a first conductivity type substrate made of silicon carbide, a drift layer of a first conductivity type formed on the first conductivity type substrate by epitaxial growth, a first gate region of a second conductivity type formed on the drift layer by epitaxial growth, and a source region of the first conductivity type formed on the first gate region by epitaxial growth or ion implantation;

forming a strip-like trench that penetrates through the source region and the first gate region, and reaches the drift layer with one direction as a longitudinal direction;

forming a channel layer of the first conductivity type on an inner wall of the trench by epitaxial growth;

forming a second conductivity type second gate region on the channel layer by epitaxial growth;

planarizing the channel layer and the second gate region to expose the source region;

after the planarizing, forming the second concave portion having a depth deeper than the source region, and as deep as a boundary portion between the source region and the first gate region is exposed, in an outer peripheral region surrounding a cell region, with a region in which the trench is formed as the cell region in which the Junction Field Effect Transistor (JFET) is configured, by conducting selective etching;

after forming the second concave portion, detecting a thickness of the source region by observing a pn junction between the source region and the first gate region exposed by the second concave portion, conducting selective etching on the basis of the detection result to form the first concave portion deeper than the thickness of the source region inside of the outer peripheral region in an outer periphery of the cell region, and to make the second concave portion deeper than the second gate region;

after forming an interlayer insulating film on surfaces of the second gate region, the channel region, and the source region, forming contact holes in the interlayer insulating film, and forming a gate electrode connected to at least one of the first gate region and the second gate region, and a source electrode connected to the source region through the contact holes; and forming a drain electrode on a rear surface of the first conductivity type substrate.

2. The method of manufacturing the silicon carbide semiconductor device according to claim 1, wherein in the selective etching for forming the first concave portion and making the second concave portion deeper, the source region, the channel layer, and the second gate region on both of leading ends of the trench are removed by the first concave portion.

3. The method of manufacturing the silicon carbide semiconductor device according to claim 1, wherein the observation of the pn junction is conducted by SEM observation.

4. The method of manufacturing the silicon carbide semiconductor device according to claim 1, further comprising after conducting the selective etching for forming the first concave portion and making the second concave portion deeper, forming a second conductivity type resurf layer extending from a side surface to a bottom surface of the second concave portion within the drift layer.

5. The method of manufacturing the silicon carbide semiconductor device according to claim 1, further comprising removing an etching damage layer by the selective etching for forming the second concave portion, after forming the second concave portion and before conducting the selective etching for forming the first concave portion and making the second concave portion deeper.

6. The method of manufacturing the silicon carbide semiconductor device according to claim 5, wherein the removal of the etching damage layer includes sacrificial oxidation.

7. The method of manufacturing the silicon carbide semiconductor device according to claim 5, wherein the removal of the etching damage layer includes chemical dry etching.

8. The method of manufacturing the silicon carbide semiconductor device according to claim 1, further comprising during the forming of the second concave portion, simultaneously forming a reference portion for measuring layers in the semiconductor substrate in order to determine etching depth.

9. The method of manufacturing the silicon carbide semiconductor device according to claim 8, wherein in the simultaneously forming a reference portion, the reference portion exposes the source region and the first gate region.

10. The method of manufacturing the silicon carbide semiconductor device according to claim 8, wherein in the simultaneously forming a reference portion, the reference portion is located in an electric field relaxation region, which is located between the cell region and the outer peripheral region.

* * * * *